United States Patent
Kwon et al.

(10) Patent No.: US 7,563,672 B2
(45) Date of Patent: Jul. 21, 2009

(54) METHODS OF FABRICATING INTEGRATED CIRCUIT DEVICES INCLUDING METAL-INSULATOR-METAL CAPACITORS

(75) Inventors: Dae-Jin Kwon, Gyeonggi-do (KR); Jung-Min Park, Gyeonggi-do (KR); Seok-Jun Won, Seoul (KR); Min-Woo Song, Gyeonggi-do (KR); Weon-hong Kim, Gyeonggi-do (KR); Ju-youn Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 178 days.

(21) Appl. No.: 11/593,670

(22) Filed: Nov. 7, 2006

(65) Prior Publication Data

US 2007/0111506 A1 May 17, 2007

(30) Foreign Application Priority Data

Nov. 12, 2005 (KR) .................. 10-2005-0108305

(51) Int. Cl.
*H01L 21/8242* (2006.01)

(52) U.S. Cl. .................. 438/253; 438/238; 438/239; 438/243; 438/244; 438/381; 438/393; 438/396; 438/957; 257/E21.008; 257/E27.016; 257/E27.048

(58) Field of Classification Search .............. 438/238, 438/239, 243, 244, 250, 253, 381, 393, 396, 438/957; 257/E21.008, E27.016, E27.048
See application file for complete search history.

(56) References Cited

U.S. PATENT DOCUMENTS

| 6,183,614 | B1 |   | 2/2001 | Fu |   |
|---|---|---|---|---|---|
| 6,306,265 | B1 |   | 10/2001 | Fu et al. |   |
| 6,576,525 | B2 | * | 6/2003 | Stamper | 438/386 |
| 6,790,323 | B2 |   | 9/2004 | Fu et al. |   |
| 7,183,649 | B1 | * | 2/2007 | Londergan et al. | 257/753 |
| 7,238,628 | B2 | * | 7/2007 | Demaray et al. | 438/785 |
| 7,320,943 | B2 | * | 1/2008 | Lee | 438/778 |
| 7,404,877 | B2 | * | 7/2008 | Demaray et al. | 204/192.15 |
| 7,442,982 | B2 | * | 10/2008 | Won et al. | 257/306 |
| 2002/0041028 | A1 | * | 4/2002 | Choi et al. | 257/751 |
| 2005/0051424 | A1 |   | 3/2005 | Fu et al. |   |
| 2005/0211545 | A1 | * | 9/2005 | Cerio et al. | 204/192.3 |

FOREIGN PATENT DOCUMENTS

| JP | 2001-210800 | 8/2001 |
|---|---|---|
| JP | 2004-072119 | 3/2004 |
| KR | 1020040011837 A | 2/2004 |

* cited by examiner

*Primary Examiner*—Andy Huynh
(74) *Attorney, Agent, or Firm*—Myers Bigel Sibley & Sajovec

(57) ABSTRACT

Integrated circuit devices including metal-insulator-metal (MIM) capacitors are provided. The MIM capacitors may include an upper electrode having first and second layers. The first layer of the upper electrode includes a physical vapor deposition (PVD) upper electrode and the second layer of the upper electrode includes an ionized PVD (IPVD) upper electrode on the PVD upper electrode. Related methods are also provided.

7 Claims, 10 Drawing Sheets

METHODS OF FABRICATING INTEGRATED CIRCUIT DEVICES INCLUDING METAL-INSULATOR-METAL CAPACITORS

CLAIM OF PRIORITY

This application is related to and claims priority from Korean Patent Application No. 10-2005-0108305 filed on Nov. 12, 2005, in the Korean Intellectual Property Office, the disclosure of which is hereby incorporated herein by reference as if set forth in its entirety.

FIELD OF THE INVENTION

The present invention generally relates to integrated circuit devices and, more particularly, to integrated circuit devices including capacitors and methods of manufacturing the same.

BACKGROUND OF THE INVENTION

Capacitors can be classified as, for example, metal-oxide-silicon (MOS) capacitors, PN-junction capacitors, polysilicon-insulator-polysilicon (PIP) capacitors, metal-insulator-metal (MIM) capacitors, and the like, according to their junction structures. Specifically, capacitors, other than MIM capacitors, use monocrystalline or polycrystalline silicon as at least one electrode material. The use of monocrystalline or polycrystalline silicon as an electrode material may cause a reduction in the resistance of capacitor electrodes. Moreover, when a bias voltage is applied to a monocrystalline or polycrystalline silicon electrode, a depletion region may be formed and the voltage may become unstable, which may make it difficult to maintain the capacitance at a uniform level.

Accordingly, MIM capacitors have been applied in radio frequency (RF) devices, various analog/mixed-signal devices, and the like. For example, MIM capacitors have been used as RF capacitors for high frequency circuits, analog capacitors or filters for wired/wireless communications, capacitors for image sensors, capacitors for LCD Driver ICs (LDIs), and the like.

The capacitance-versus-voltage relationship of an MIM capacitor is generally represented by a quadratic equation. It may, therefore, be desirable to maintain the voltage coefficient of capacitance (abbreviated to "VCC"), which is a quadratic coefficient in the quadratic equation, at less than a threshold value, so that an integrated circuit device having the MIM capacitor can operate in a stable manner within a predictable range. Furthermore, to attain a stable, error-free integrated circuit device, the scattering of VCC values of a plurality of MIM capacitors formed on a given wafer is typically as small as possible.

SUMMARY OF THE INVENTION

Some embodiments of the present invention provide integrated circuit devices including metal-insulator-metal (MIM) capacitors. The MIM capacitors may include a lower electrode, a dielectric film, an upper electrode having first and second layers. The first layer of the upper electrode includes a physical vapor deposition (PVD) upper electrode and the second layer of the upper electrode includes an ionized PVD (IPVD) upper electrode on the PVD upper electrode.

In further embodiments of the present invention, the IPVD upper electrode has a thickness that is at most about 50% of a total thickness of the upper electrode.

In still further embodiments of the present invention, the lower electrode may include a PVD barrier film and an IPVD barrier film on the PVD barrier film. In certain embodiments of the present invention, a surface of the lower electrode may be nitridated.

Some embodiments of the present invention provide integrated circuit devices including metal-insulator-metal (MIM) capacitors. The MIM capacitors include first and second layers. The first layer of the upper electrode includes a first IPVD upper electrode and the second layer of the upper electrode includes a second IPVD upper electrode.

In further embodiments of the present invention, the second IPVD upper electrode may have a thickness that is no more than about 50% of a total thickness of the upper electrode.

Although embodiments of the present invention are primarily discussed above with respect to integrated circuit devices, methods of fabricating integrated circuit devices are also provided herein.

DETAILED DESCRIPTION OF EMBODIMENTS OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1A:
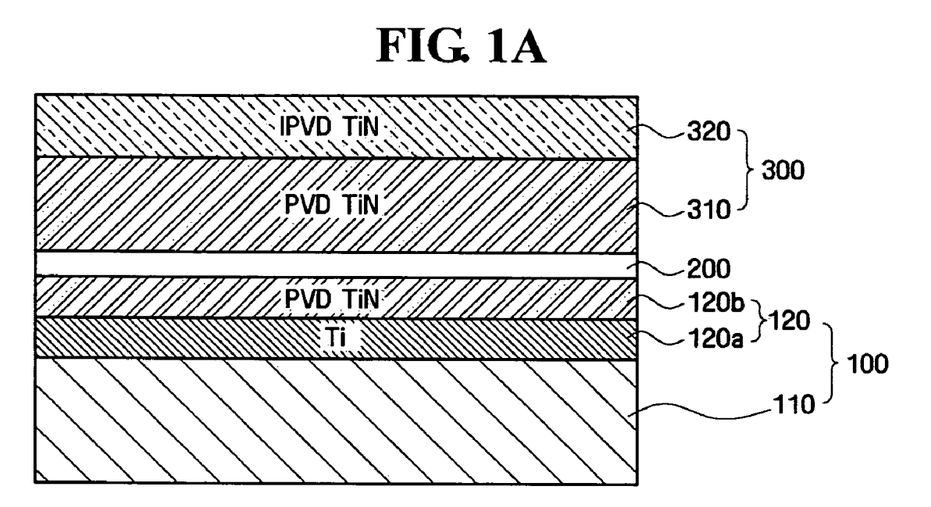
FIGS. 1A through 1C are cross sections illustrating metal-insulator-metal (MIM) capacitors included in integrated circuit devices according to some embodiments of the present invention.
Figure 1B:
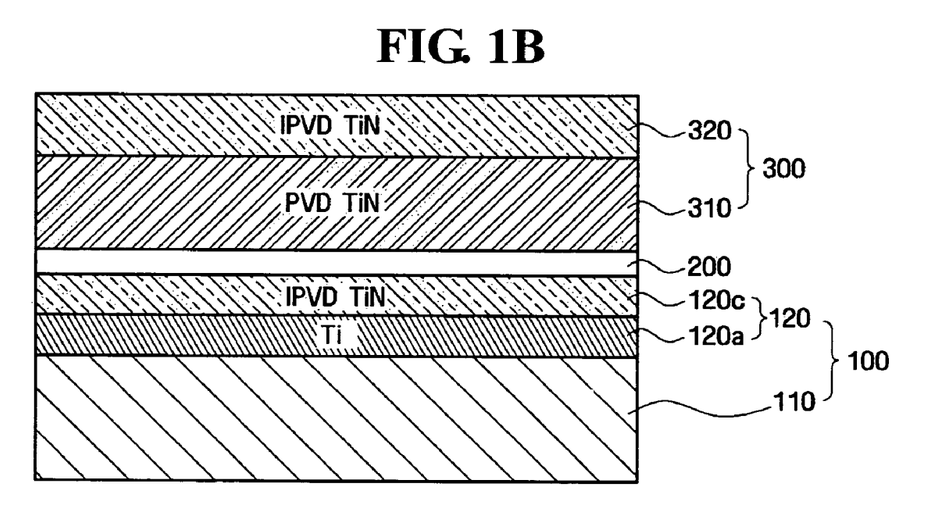
Figure 1C:
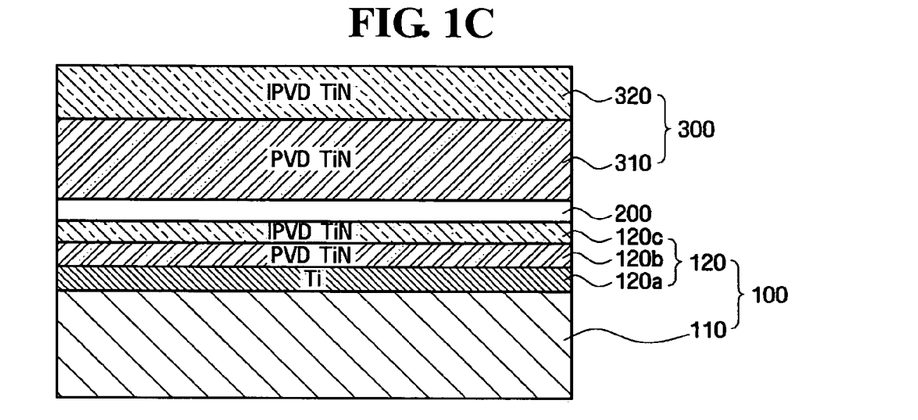

Referring first to FIGS. 1A through 1C, cross sections of MIM capacitors according to some embodiments of the present invention will be discussed. As illustrated in FIGS. 1A through 1C, MIM capacitors in integrated circuit devices according to some embodiments of the present invention include a lower electrode 100, a dielectric film 200, and an upper electrode 300.

To demonstrate a normal capacitance-voltage (C-V) curve and a good VCC scattering characteristic, in each of the MIM capacitors, the upper electrode 300 of the MIM capacitor includes a physical vapor deposition (PVD) upper electrode 310 and an ionized PVD (IPVD) upper electrode 320. Although the upper electrode 300 illustrated in FIGS. 1A through 1C includes TiN, embodiments of the present invention are not limited to this configuration. For example, the upper electrode 300 may also include, for example, Ti, TaN, Ta, W, WN, HfN and/or ZrN without departing from the scope of the present invention.

The presence of the PVD upper electrode 310 may allow the MIM capacitors 20 to demonstrate a normal C-V curve and a good VCC scattering characteristic, and the IPVD upper electrode 320 may reduce the likelihood that the upper electrode 300 will be etched during a subsequent via etching process.

Figure 2:
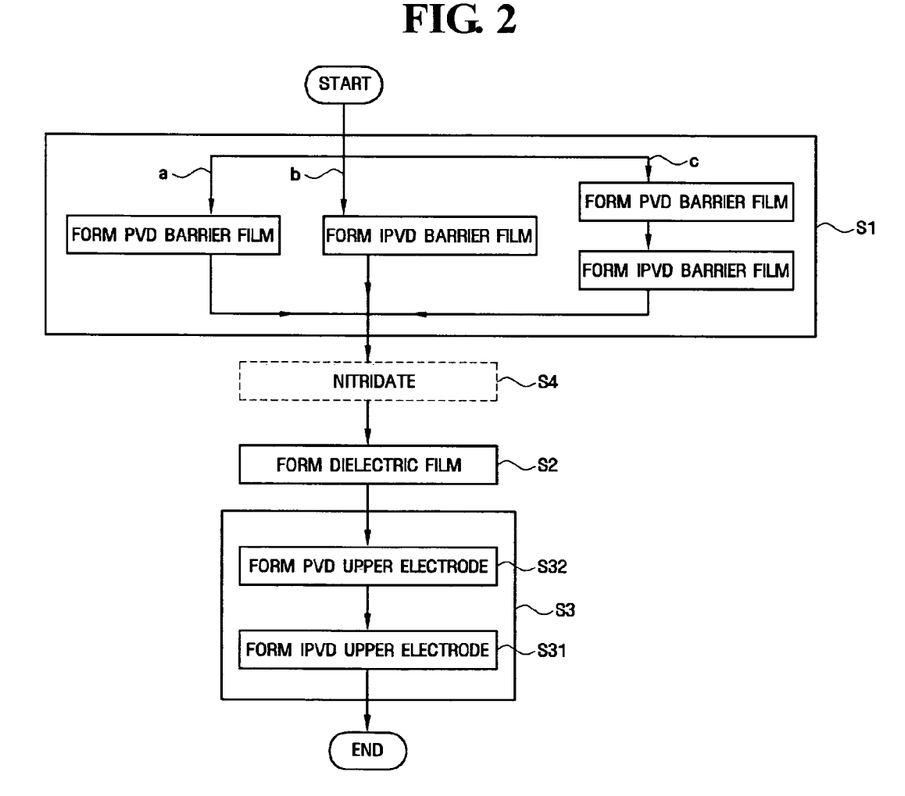
FIG. 2 is a flowchart illustrating processing steps in the fabrication of MIM capacitors in integrated circuit devices according to some embodiments of the present invention.

FIG. 2 is a flowchart illustrating processing steps in the fabrication of MIM capacitors in integrated circuit devices according to some embodiments of the present invention. FIG. 2 will be discussed herein with respect to various figures and the blocks of FIG. 2 will be discussed out of order. However, generally, FIG. 2 illustrates formation of a barrier film (block S1), an optional nitridation step (block S4) as indicated by the dotted lines, formation of a dielectric film (block S2) and formation of the upper electrode (block S3) according to various embodiments of the present invention.

Referring now to FIGS. 1A through 1C and FIG. 2, formation of the upper electrode 300 (block S3), which may include sequentially forming the PVD upper electrode 310 (block S31) and formation the IPVD upper electrode 320 (block S32) are illustrated therein.

Figure 3:
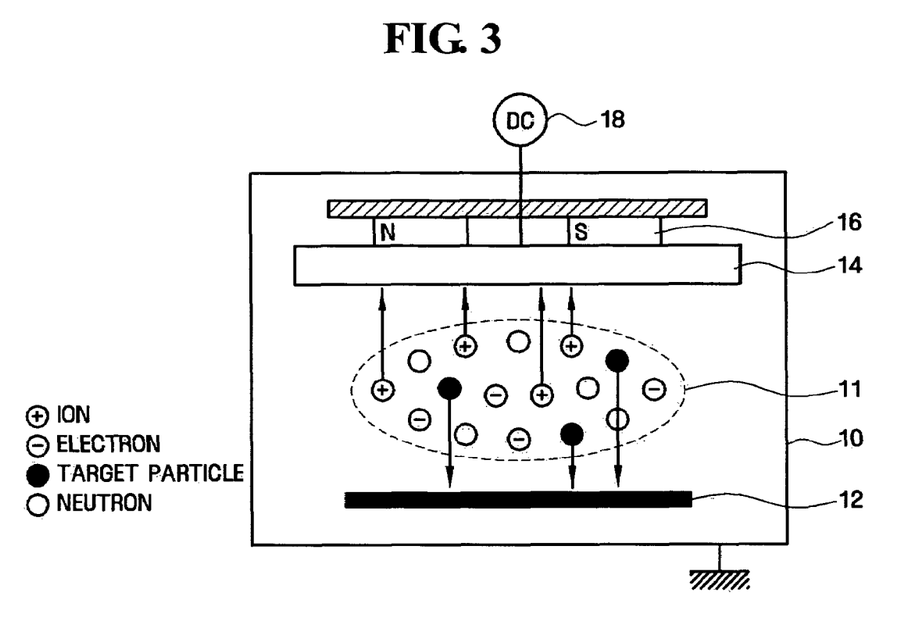
FIG. 3 is a schematic diagram illustrating a physical vapor deposition (PVD) system used in methods of manufacturing MIM capacitors in integrated circuit devices according to some embodiments of the present invention.

In some embodiments of the present invention, the PVD upper electrode 310 (block S32) may be formed using a PVD system illustrated in FIG. 3. Referring now to FIG. 3, a pedestal 12 for loading a semiconductor substrate (not shown) is disposed in a lower portion of a chamber 10 of the PVD system and a target 14 composed of a deposition material is disposed in an upper portion of the chamber 10. A magnetic field is applied into the chamber 10 by a magnet 16 disposed behind the target 14, and reaction gases supplied into the chamber 10 are accelerated under the magnetic field, thereby generating a high density plasma 11. Cations in the plasma 11 collide with the target 14 to which a negative DC voltage 18 is applied, thereby generating sputtered target particles. The sputtered target particles are deposited on a substrate (not shown) disposed on the pedestal 12.

In some embodiments of the present invention, the IPVD upper electrode 320 (block S31) may be formed using an IPVD) system. The IPVD system is an apparatus that ionizes sputtered target particles and enhances the directionality of the ionized particles by applying a RF bias to a substrate, thereby improving step coverage, unlike the PVD system of FIG. 3 discussed above. The IPVD system may be, for example, an Ion Metal Plasma (IMP) sputter (AMAT), a Self Ionized Plasma (SIP) sputter (AMAT), or a Hollow Cathode Magnetron (HCM) sputter (NOVELLUS).

As discussed above, in some embodiments of the present invention, the IPVD system may be a SIP sputter. Although embodiments of the present invention are discussed herein as using a SIP sputter as the IPVD system, embodiments of the present invention are not limited to this configuration. For example, the IPVD system may also be an IMP sputter or a HCM sputter, instead of a SIP sputter. Details of the SIP sputter are discussed, for example, in U.S. Pat. Nos. 6,183,614, 6,306,265 and 6,790,323, and U.S. Patent Application Publication No. 20050051424, the disclosures of which are hereby incorporated herein by reference as if fully set forth herein.

Figure 4:
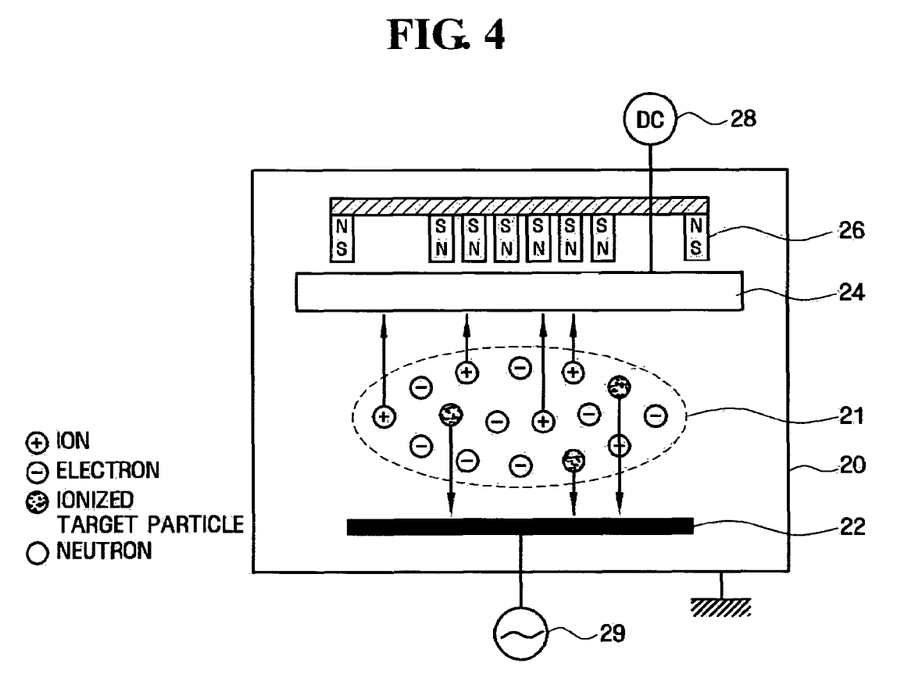
FIG. 4 is a schematic diagram illustrating an ionized PVD (IPVD) system used in methods of manufacturing MIM capacitors in integrated circuit devices according to some embodiments of the present invention.

Referring now to FIG. 4, a schematic block diagram illustrating an ionized IPVD system used in accordance with methods of manufacturing MIM capacitors of integrated circuit devices according to some embodiments of the present invention will be discussed. As illustrated in FIG. 4, a pedestal 22 for loading a semiconductor substrate (not shown) is disposed in a lower portion of a chamber 20, and a target 24 composed of a deposition material is disposed in an upper portion of the chamber 20. A magnetic field is applied into the chamber 20 by a magnet 26 disposed behind the target 24, and reaction gases supplied into the chamber 20 are accelerated under the magnetic field, thereby generating a high density plasma 21. Cations in the plasma 21 collide with the target 24 to which a negative DC voltage 28 is applied, thereby generating sputtered target particles. Furthermore, the magnet 26 ionizes the sputtered target particles, thereby generating ionized target particles. The ionized target particles may exhibit improved directionality by RF substrate bias applied to the pedestal 22 from an RF power source 29. In this state, the ionized target particles are deposited on a substrate.

Figure 5:
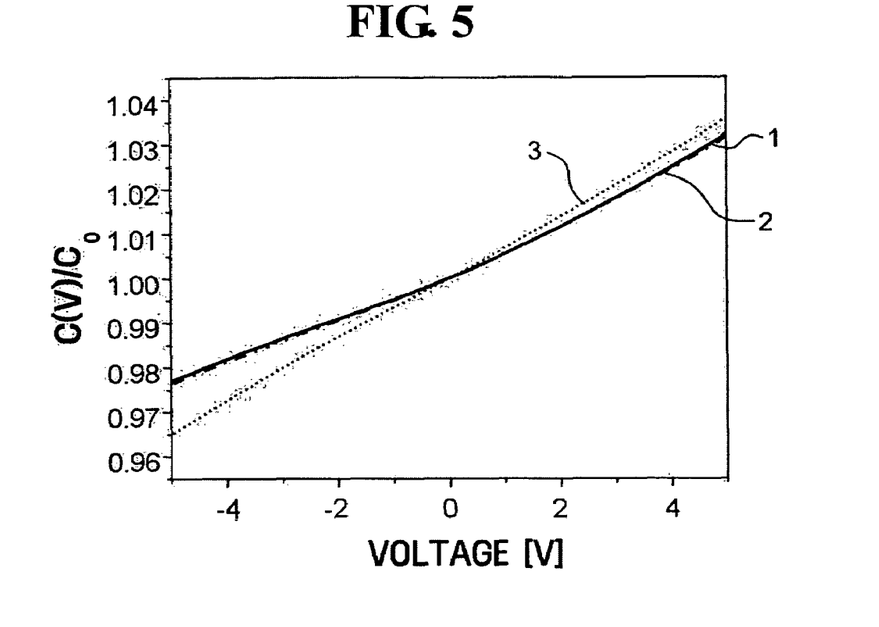
FIG. 5 is a graph illustrating capacitance-voltage (C-V) curves of MIM capacitors having an IPVD TiN film used as an upper electrode according to some embodiments of the present invention.
Figure 6A:
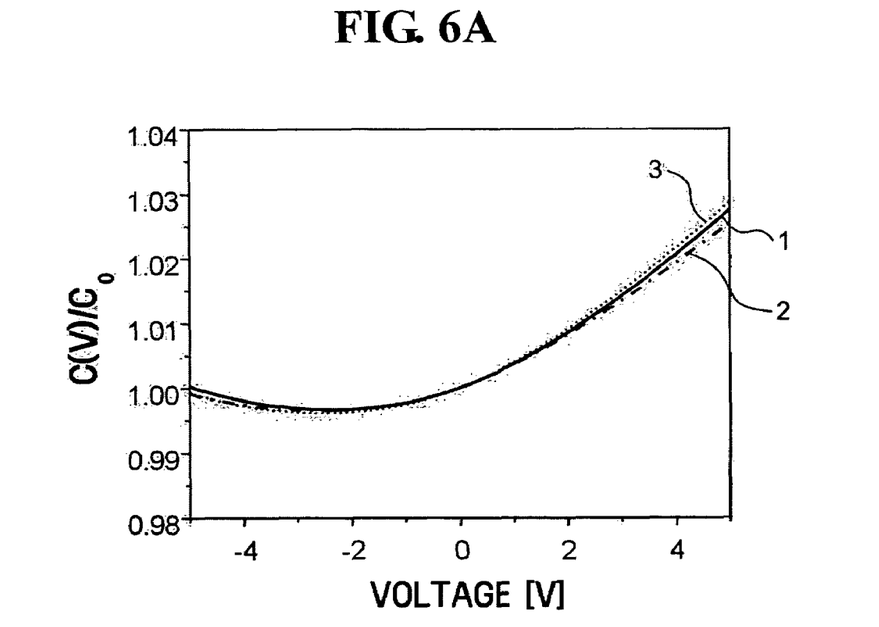
FIG. 6A is a graph illustrating C-V curves of MIM capacitors having a PVD TiN film used as an upper electrode according to some embodiments of the present invention.
Figure 6B:
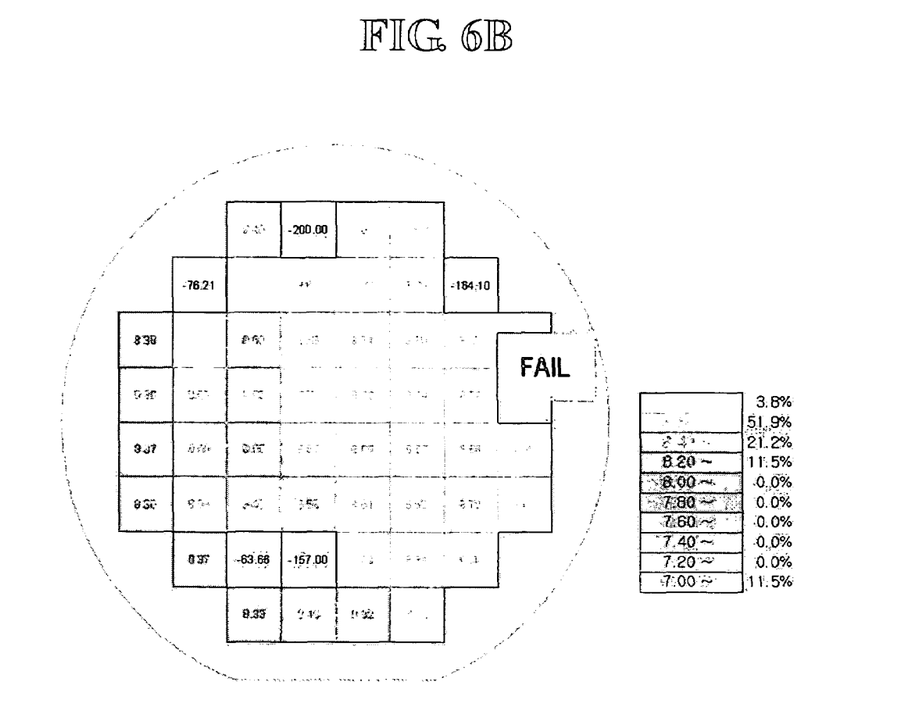
FIG. 6B is a capacitance map of MIM capacitors illustrated in FIG. 6A, as measured on a wafer, according to some embodiments of the present invention.

As discussed above, according to some embodiments of the present invention, an upper electrode 300 is formed in a stacked structure of a PVD upper electrode 320 and an IPVD upper electrode 310. Typically, either a PVD upper electrode or an IPVD upper electrode is used as an upper electrode of an MIM capacitor. However, conventional upper electrode structures typically do not satisfy desired characteristics of an MIM capacitor, as illustrated in FIGS. 5 through 6B.

In particular, referring first to FIG. 5, C-V curves of MIM capacitors wherein an IPVD TiN film (a thickness of 1000 Å) is used as an upper electrode will be discussed. In a normal C-V curve, the capacitance-versus-voltage relationship of a MIM capacitor is generally represented by a quadratic equation, as given by Equation 1 below:

$$C = C0(\alpha V^2 + \beta V + 1) \qquad \text{Equation (1)}$$

where C0 is capacitance when V is zero (0).

As illustrated by Equation 1, when $\alpha(\text{ppm}/V^2)$ is as small as possible and $\beta(\text{ppm}/V)$ is as close as possible to zero (0), the obtained C-V curve becomes symmetric with respect to the C-axis and becomes nearly linear. As a result, it may be possible to realize MIM capacitors showing predictable operating characteristics. Currently available analog/mixed-signal devices have a values of 1,200 (ppm/$V^2$) or less and degree of scattering in α values, hereinafter referred to as "degree of scattering in VCCs," of about 10.0% or less.

However, the C-V curves illustrated in FIG. 5 illustrate an abnormal deviation from the above requirements. Moreover, the C-V curve (3) of a MIM capacitor on a left edge of a wafer with respect to the C-V curve (1) of a MIM capacitor on a center portion of the wafer and the C-V curve (2) of a MIM capacitor on a right edge of the wafer shows a large degree of scattering in VCCs of 10.0% or more.

Referring now to FIGS. 6A and 6B, C-V curves of MIM capacitors have a PVD film having a thickness of about 1000 Å used as an upper electrode and a capacitance map of the MIM capacitors of FIG. 6A, as measured on a wafer, will be discussed. Referring first to FIG. 6A, when a PVD film is used as an upper electrode, a normal C-V curve is obtained. The C-V curve (2) of MIM capacitors on a left edge of a wafer and the C-V curve (3) of MIM capacitors on a right edge of the wafer with respect to the C-V curve (1) of MIM capacitors on a center portion of the wafer show a low degree of scattering in VCCs of about 7.5%. However, as illustrated in FIG. 6B, when a PVD film is used as an upper electrode, a plurality of fail spots in which MIM capacitors have a negative capacitance may be observed in edges of a wafer. Numerical values in FIG. 6B represent capacitances (fF/μm$^2$)

Accordingly, when only an IPVD film is used as an upper electrode, ionized target particles having better directionality by RF substrate bias may be deposited on a dielectric film. Thus, a surface of the dielectric film may be adversely affected possible causing interface characteristics between the dielectric film and the upper electrode to become unstable, thereby possibly resulting in an abnormal C-V curve and a very large degree of scattering in VCCs. When only a PVD film is used as an upper electrode, the underlying dielectric film may be exposed during a subsequent via etching process due to poor film compactness causing a low etching resistance of the upper electrode, thereby possibly resulting in abnormal operation and failures of the MIM capacitors.

Thus, according to some embodiments of the present invention, an upper electrode may be provided using a PVD upper electrode which may not adversely affect a surface of the dielectric film because target particles are not ionized and RF substrate bias is not applied on a dielectric film and an IPVD upper electrode which shows good film compactness against via etching, on the PVD upper electrode. The use of the above-described upper electrode may allow MIM capacitors to show a normal C-V curve and good VCC scattering characteristic, and at the same time, the upper electrode may not be easily etched during a subsequent via etching process, thereby possibly providing MIM capacitors without errors.

In some embodiments of the present invention, the thickness of an IPVD upper electrode may be about 50% or less of a total thickness of an upper electrode. For example, a thickness ratio of an IPVD upper electrode to a PVD upper electrode may be from about 2:8 to about 4:6. When forming an IPVD upper electrode, DC power may be from about 10.0 to about 30.0 kW, the frequency of RF power may be about 13.56 MHz, and the RF power may be from about 100 to about 1000 W. In certain embodiments of the present invention, RF power of from about 400 to about 500 W may be applied.

Referring again to FIGS. 1A through 1C, the lower electrode 100, together with the above-described upper electrode 300, constituting MIM capacitors, includes a main lower electrode 110 and a capping lower electrode 120. The main lower electrode 110 may include, for example, aluminum or copper having good electrical conductivity. The capping lower electrode 120 may include a stacked structure of a contact film 120a for promoting a contact with the main lower electrode 110, and a barrier film 120b, 120c, or 120b/120c capable of reducing the likelihood of diffusion of a material constituting the main lower electrode 110.

Although FIGS. 1A through 1C illustrate that a stacked structure of TiN/Ti is used as a stacked structure of the barrier film 120b, 120c, or 120b/120c and the contact film 120a, embodiments of the present invention are not limited to this configuration. For example, a stacked structure of TaN/Ta, WN/W, or the like, may also be used without departing from the scope of the present invention.

Referring again to FIGS. 1A through 1C and 2, in formation of a barrier film (block S1), a PVD barrier film, as illustrated in FIG. 1A, may be formed on a substrate having a main lower electrode and a contact film formed thereon via a route a. An IPVD barrier film, as illustrated in FIG. 1B, may be formed on a substrate having a main lower electrode and a contact film formed thereon via a route b. A stacked structure of a PVD barrier film and an IPVD barrier film, as illustrated in FIG. 1C, may be formed on a substrate having a main lower electrode and a contact film via a route c.

When a barrier film is formed as an IPVD barrier film 120c or a stacked structure of a PVD barrier film and an IPVD barrier film 120b/120c according to some embodiments of the present invention, leakage current characteristics may be improved.

Figure 7:
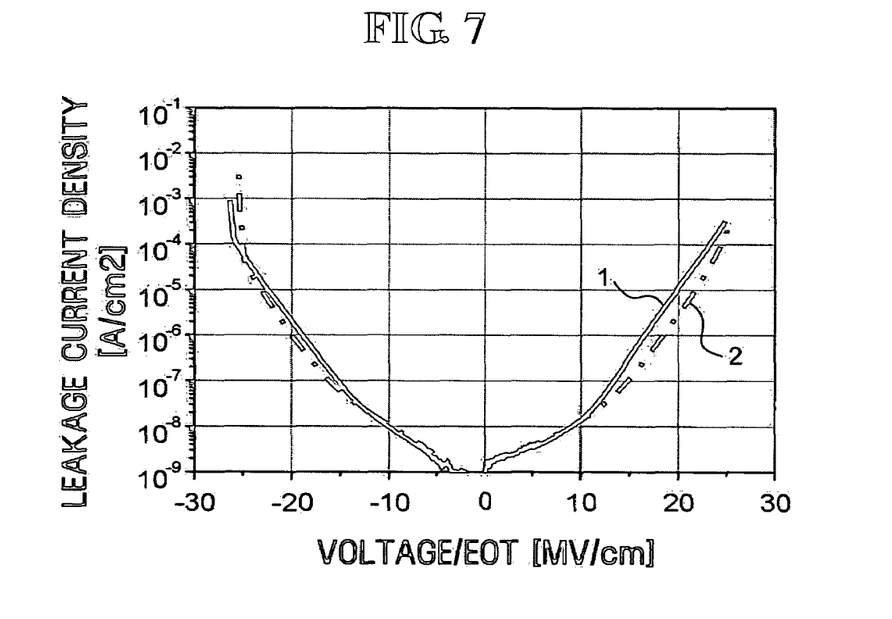
FIG. 7 is a graph illustrating leakage current characteristics of MIM capacitors having a PVD TiN barrier film and a MIM capacitor including a stacked structure of a PVD TiN barrier film and an IPVD TiN barrier film according to some embodiments of the present invention.

Referring now to FIG. 7, a graph illustrating leakage current characteristics will be discussed. As illustrated in FIG. 7, leakage current characteristics (2) of an MIM capacitor including an IPVD TiN barrier film (400 Å) and a PVD TiN barrier film (400 Å) are better than the leakage current characteristics (1) of an MIM capacitor including a PVD TiN barrier film.

In some embodiments of the present invention, the thickness of an IPVD barrier film may be 50.0% or less of a total thickness of a stacked barrier film to possibly improve leakage current characteristics and a degree of scattering in VCCs. For example, a thickness ratio of an IPVD barrier film and a PVD barrier film may be from about 1:1 to about 1:10.

Referring again to FIG. 2, in formation of a dielectric film (block S2), the dielectric film may include, for example, a mono-layered or multi-layered film made of oxide or nitride of Al, Hf, Zr, La, Si, Ta, Ti, Sr, Ba, Pb, Cr, Mo, W, Y, Mn, or a combination thereof. Thus, the formation of the dielectric film may be performed using one of various methods well known to those skilled in the art and, therefore, a detailed description thereof will be omitted in the interest of brevity.

After the formation of the barrier film (block S1), nitridation of a surface of the lower electrode may be optionally performed (block S4) prior to forming the dielectric film (block S2), the details of which were discussed above. The nitridation may be, for example, a plasma treatment using a nitrogen-based gas, for example, $NH_3$ or $N_2$. The nitridation may be performed at a temperature of from about 100 to about 500° C. for from about 10.0 seconds to about 10.0 minutes. The nitridation may also based on the fact that C-V curve and the degree of scattering in VCCs of MIM capacitors may be affected by nitridation as discussed above.

Figure 8:
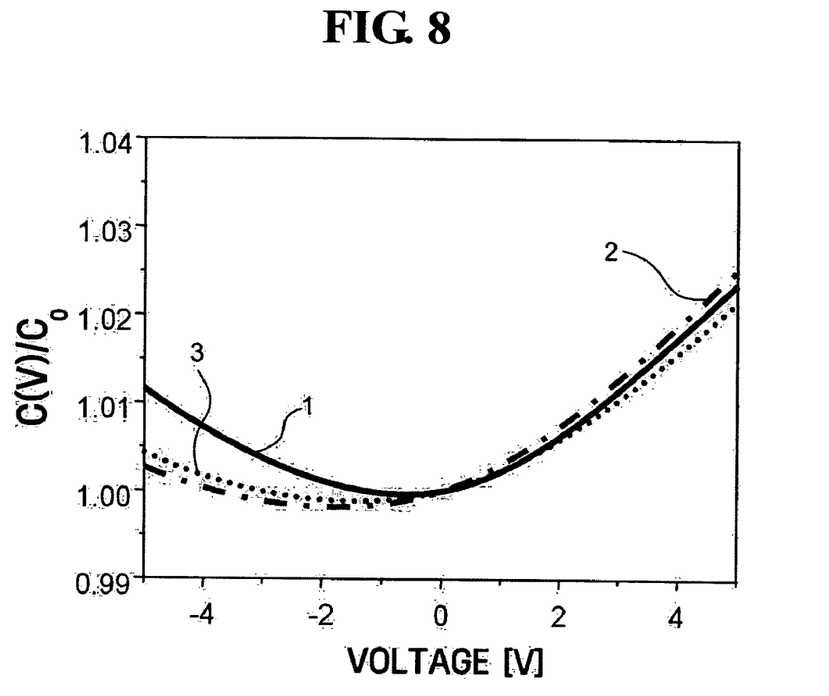
FIG. 8 is a graph illustrating C-V curves of MIM capacitors having an IPVD TiN film used as an upper electrode, the MIM capacitors being manufactured by $NH_3$ plasma treatment after forming a lower electrode according to some embodiments of the present invention.

FIG. 8 illustrates C-V curves of MIM capacitors including an IPVD TiN upper electrode with a thickness of 1,000 Å, which are substantially the same as the MIM capacitors used in FIG. 5 except that they are manufactured by an $NH_3$ plasma treatment after forming a lower electrode. The $NH_3$ plasma treatment was performed at about 300° C. for about one minute.

Referring now to FIGS. 5 and 8, the MIM capacitors of FIG. 8 illustrated relatively normal C-V curves by $NH_3$ plasma treatment, when compared with the MIM capacitors of FIG. 5. However, the $NH_3$ plasma treatment alone may reduce the degree of scattering in VCCs.

Figure 9A:
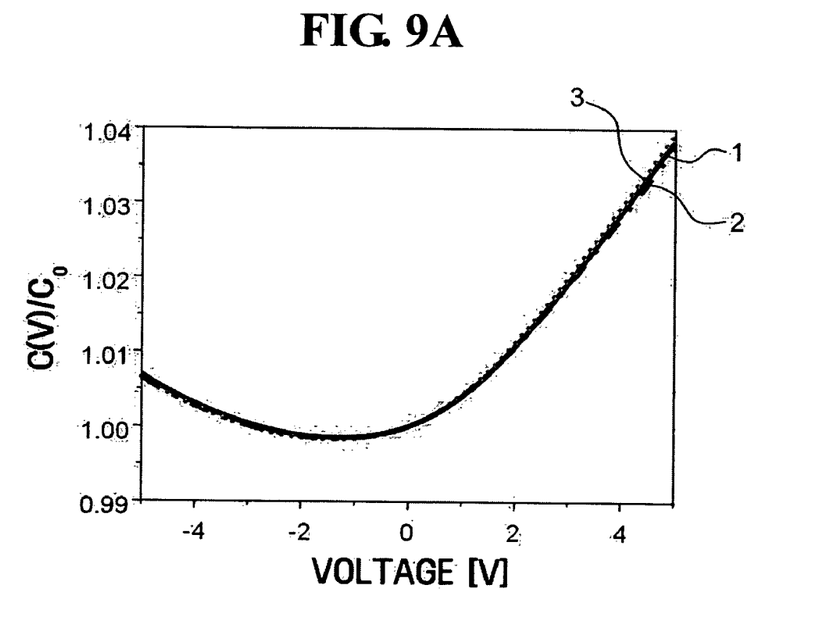
FIG. 9A is a graph illustrating C-V curves of MIM capacitors having a PVD TiN film used as an upper electrode, the MIM capacitors being manufactured by $NH_3$ plasma treatment after forming a lower electrode according to some embodiments of the present invention.
Figure 9B:
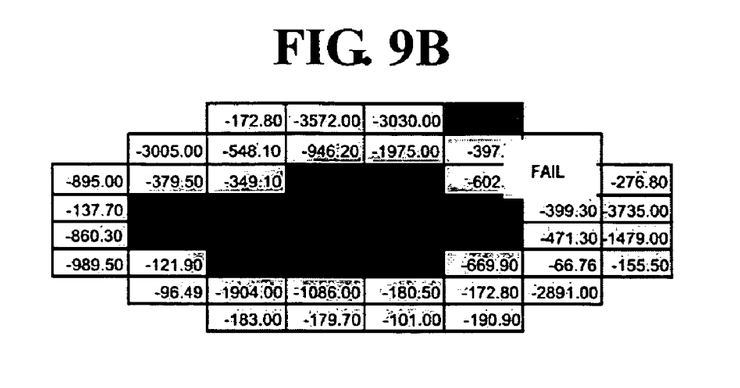
FIG. 9B is a capacitance map of the MIM capacitors of FIG. 9A, as measured on a wafer, according to some embodiments of the present invention.

FIG. 9A illustrates C-V curves of MIM capacitors including a PVD TiN upper electrode with a thickness of 1,000 Å which are substantially the same as the MIM capacitors used in FIGS. 6A and 6B except that they are manufactured by $NH_3$ plasma treatment at about 300° C. for about one minute after forming a lower electrode. FIG. 9B illustrates a capacitance map of the MIM capacitors of FIG. 9A as measured on a wafer.

Referring now to FIGS. 9A and 6A, the MIM capacitors of FIG. 9A illustrate a better C-V curve profile and a good VCC scattering characteristic by $NH_3$ plasma treatment, compared with the MIM capacitors of FIG. 6. However, the capacitance map of FIG. 9B illustrates that $NH_3$ plasma treatment alone typically cannot prevent failures from occurring at edges of a wafer.

A nitridation process removes a natural oxide film formed on a surface of a lower electrode and leads to nitridation of a surface of the lower electrode, thereby possibly improving interface characteristics between the lower electrode and a dielectric film, possibly resulting in a significant reduction in the degree of scattering in VCCs. In this regard, some embodiments of the present invention provide a MIM capacitor having an improved degree of scattering in VCCs. In particular, MIM capacitors according to some embodiments of the present invention include a combination of a nitridated lower electrode and an upper electrode including a stacked structure of a PVD upper electrode and an IPVD upper electrode.

Figure 10A:
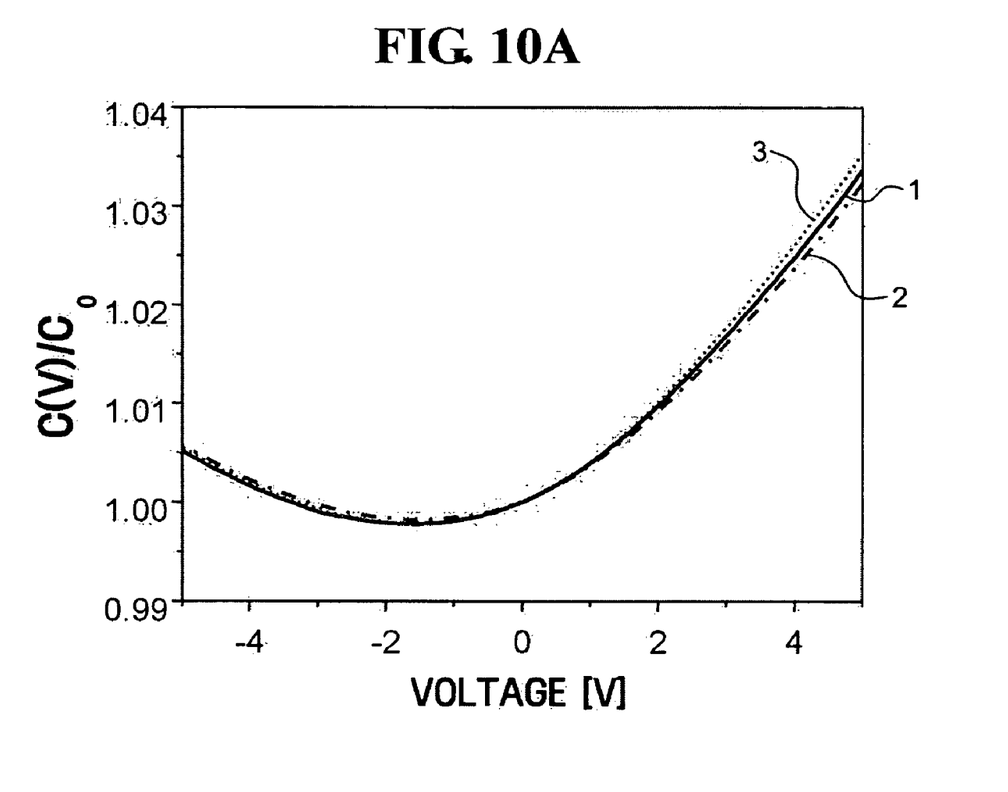
FIG. 10A is a graph illustrating C-V curves of MIM capacitors of integrated circuit devices according to some embodiments of the present invention.
Figure 10B:
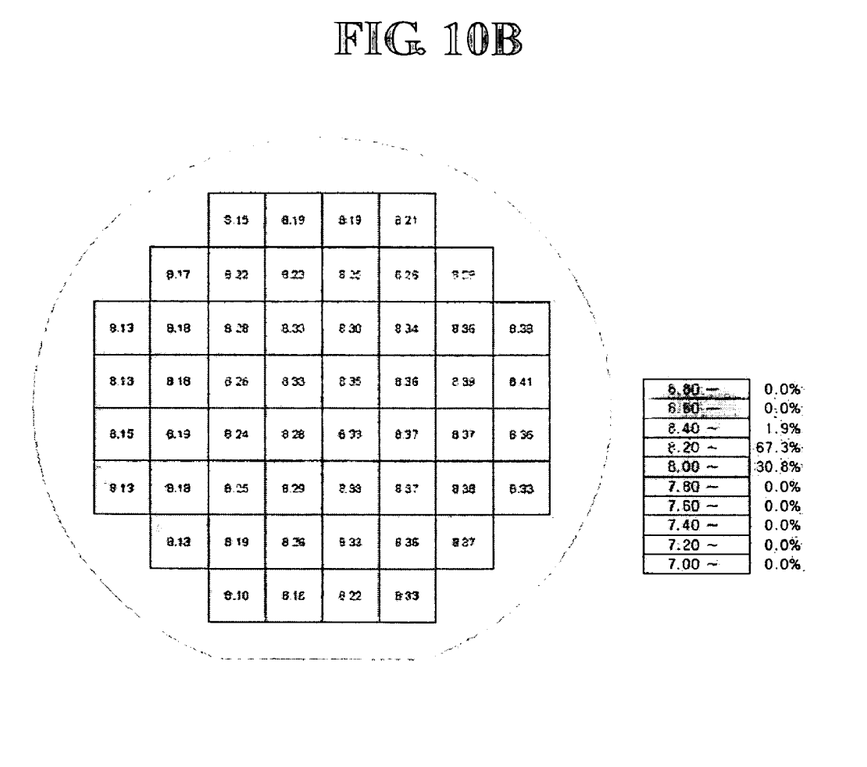
FIG. 10B is a capacitance map of the MIM capacitors of FIG. 10A, as measured on a wafer, according to some embodiments of the present invention.

Referring now to FIGS. 10A and 10B, C-V curves of MIM capacitors of a integrated circuit device according to some embodiments of the present invention and a capacitance map of the MIM capacitors of FIG. 10A, as measured on a wafer, will be discussed. The results of FIGS. 10A and 10B were obtained using MIM capacitors including a lower electrode including a main lower electrode made of Al, a Ti contact film with a thickness of about 50 Å, a PVD TiN barrier film with a thickness of about 400 Å, and a nitridated IPVD TiN barrier film with a thickness of about 400 Å, a $HfO_2+O_2$—HfNO dielectric film, and an upper electrode including a PVD TiN upper electrode with a thickness of about 600 Å and an IPVD TiN upper electrode with a thickness of about 400 Å.

Referring now to FIG. 10A, MIM capacitors of an integrated circuit device according to some embodiments of the present invention show a normal C-V curve. Moreover, the α values are 769 to 829 (ppm/V$_2$) which is much smaller than 1200 (ppm/V$_2$), and the C-V curve (2) of MIM capacitors on a left edge of a wafer and the C-V curve (3) of MIM capacitors on a right edge of the wafer with respect to the C-V curve (1) of MIM capacitors on a center portion of the wafer show a low degree of scattering in VCCs of about 7.5%. As illustrated in FIG. 10B, no capacitance failure is observed in the MIM capacitors formed on the wafer, suggesting that the likelihood of a capacitance failure can reduced according to some embodiments of the present invention.

Figure 11A:
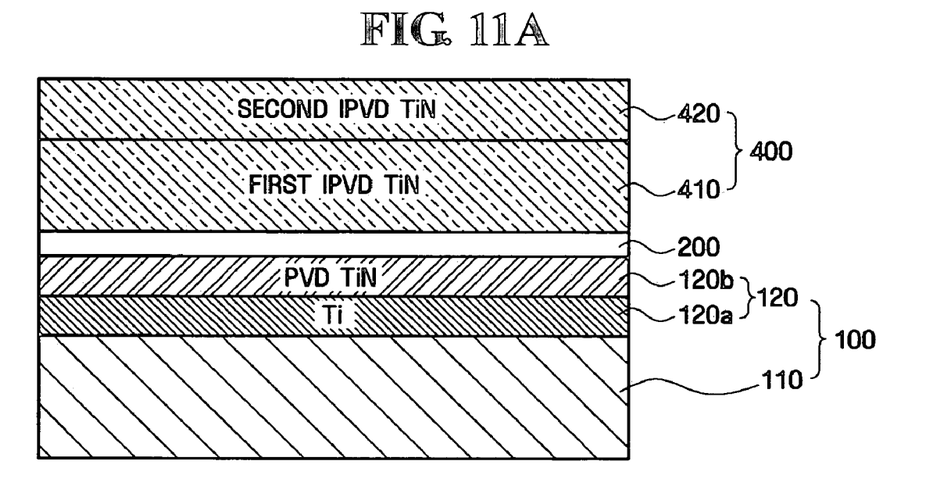
FIGS. 11A through 11C are cross sections illustrating MIM capacitors in integrated circuit devices according to some embodiments of the present invention.
Figure 11B:
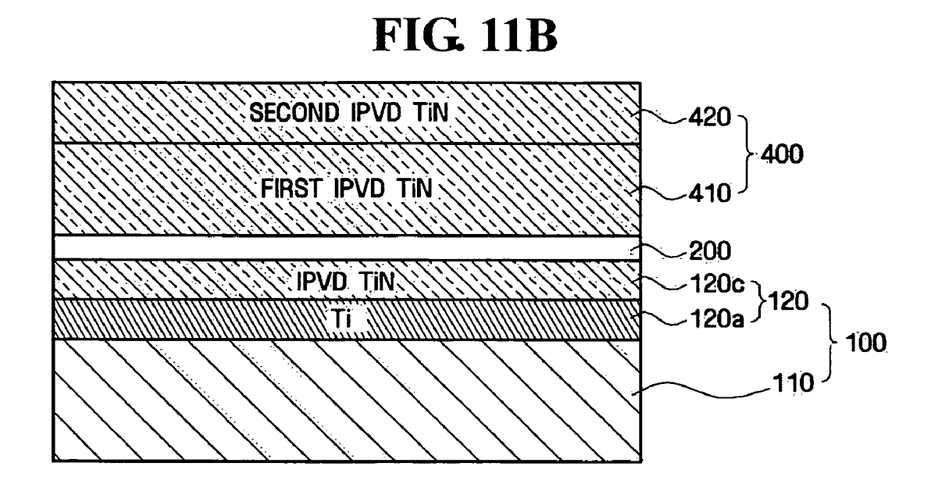
Figure 11C:
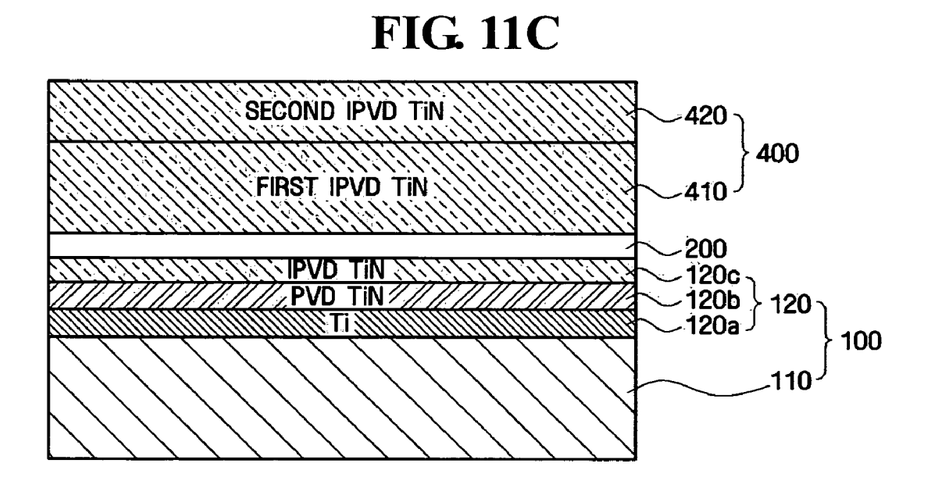
Figure 12:
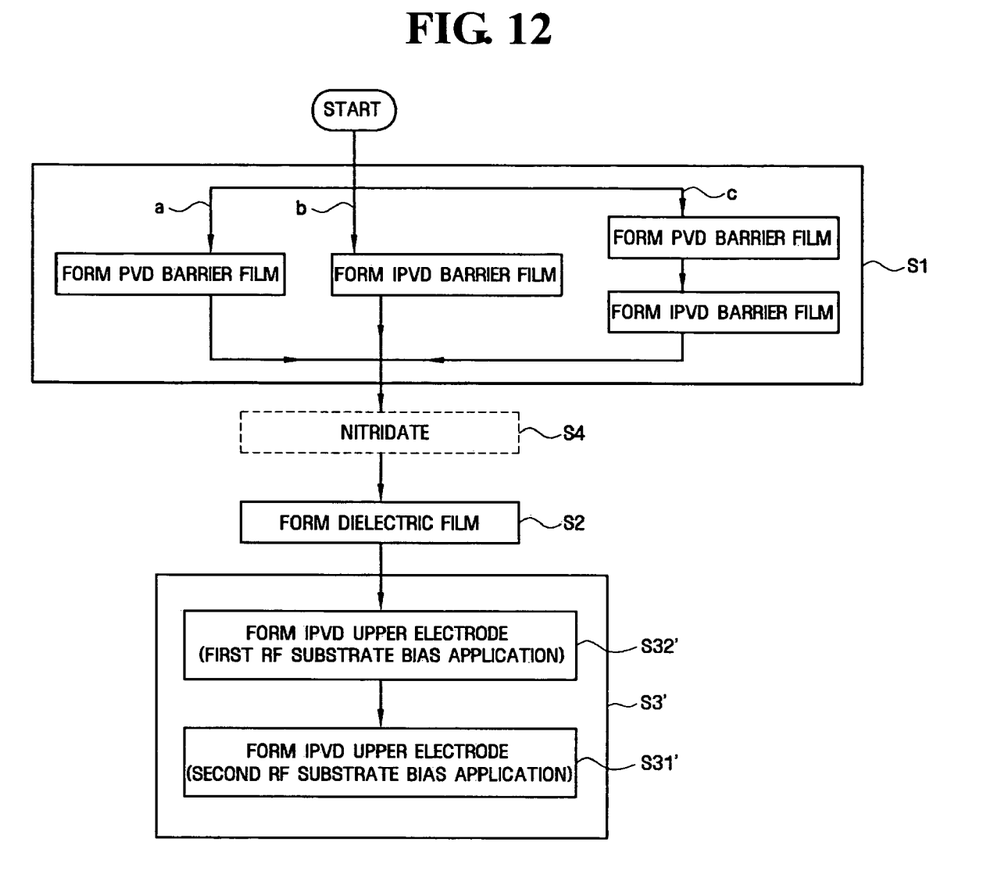
FIG. 12 is a flowchart illustrating processing steps in the fabrication of MIM capacitors in integrated circuit devices according to some embodiments of the present invention.

FIGS. 11A through 11C illustrate cross sections of MIM capacitors of integrated circuit devices according to some of embodiments of the present invention. FIG. 12 is a flowchart illustrating processing steps in the fabrication of MIM capacitors of integrated circuit devices according to some of embodiments of the present invention. Embodiments of the present invention illustrated in FIGS. 11A through 12 are substantially the same as the embodiments of the present invention illustrated in FIGS. 1 through 10B except the structure of and process of fabricating an upper electrode. Accordingly, only the differences will be discussed herein in the interest of brevity since other elements and manufacturing processes have been described above with reference to FIGS. 1 through 10B.

Referring now to FIGS. 11A through 11C, MIM capacitors of integrated circuit devices according to some embodiments of the present invention include an upper electrode including a first IPVD upper electrode 410 and a second IPVD upper electrode 420.

As illustrated in FIG. 12, together with FIGS. 1A through 1C, formation of the upper electrode 400 (block S3') includes forming the first IPVD upper electrode 410 by applying a first RF bias to a substrate (block S31') and forming the second IPVD upper electrode 420 by applying a second RF bias greater than the first RF bias to the substrate (block S32').

By applying the first RF substrate bias as small as possible, the first IPVD upper electrode 410 can have substantially the same characteristics as the PVD upper electrode 310 illustrated in FIGS. 1A through 1C, thereby providing MIM capacitors with a normal C-V curve and a good VCC scattering characteristic. Moreover, by applying the second RF substrate bias greater than the first RF substrate bias, the second IPVD upper electrode 420 is not easily etched during a subsequent via etching process, thereby possibly providing fail-free MIM capacitors. FIGS. 11A through 11C illustrate that the upper electrode 400 is made of TiN, but Ti, TaN, Ta, or the like, may also be used as an upper electrode material without departing from the scope of the present invention. The first RF substrate bias may be from about 100 to about 400 W, and the second RF substrate bias may be from about 400 to about 1000 W.

As discussed above with respect to FIGS. 1A through 12, MIM capacitors of integrated circuit devices according to some embodiments of the present invention show a normal C-V curve and a good VCC scattering characteristic. Therefore, the integrated circuit devices can possibly be operated in a stable, error-free manner. According to processing steps in the fabrication of MIM capacitors of integrated circuit devices according to some embodiments of the present invention, MIM capacitors having desired capacitance over the entire surface of a wafer regardless of the position of the wafer can be manufactured.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of fabricating an integrated circuit device including a metal-insulator-metal (MIM) capacitor, the method comprising:
   forming a lower electrode by sequentially forming a PVD barrier film and an IPVD barrier film;
   forming a dielectric film on the lower electrode; and
   forming an upper electrode having first and second layers on the dielectric film, the first layer including a PVD upper electrode and the second layer including an IPVD upper electrode by sequentially performing PVD and IPVD in which RF bias is used.

2. The method of claim 1, wherein forming the IPVD upper electrode comprises forming the IPVD upper electrode having a thickness that is no more than about 50% of a total thickness of the upper electrode.

3. The method of claim 1, further comprising nitriding a surface of the lower electrode.

4. The method of claim 3, wherein the nitriding comprises a nitrogen-based plasma treatment.

5. A method of fabricating an integrated circuit device including a metal-insulator-metal (MIM) capacitor, the method comprising:
   forming a lower electrode having a PVD barrier film and an IPVD barrier film by sequentially performing PVD and IPVD in which RF bias is used;
   nitridating a surface of the lower electrode;
   forming a dielectric film on the nitridated lower electrode; and
   forming an upper electrode having first and second layers, the first layer including a PVD upper electrode and the second layer including an IPVD upper electrode on the dielectric film by sequentially performing PVD and IPVD in which RF bias is applied to a substrate.

6. The method of claim 5, wherein forming the IPVD upper electrode comprising forming the IPVD upper electrode having a thickness that is no more than about 50% of a total thickness of the upper electrode.

7. The method of claim 5, wherein the nitridating comprises a nitrogen-based plasma treatment.

* * * * *